United States Patent [19]

Riley et al.

[11] Patent Number: 4,839,311

[45] Date of Patent: Jun. 13, 1989

[54] ETCH BACK DETECTION

[75] Inventors: Paul E. Riley, Columbia, Md.; Vivek D. Kulkarni, Sunnyvale; Egil D. Castel, Cupertino, both of Calif.

[73] Assignee: National Semiconductor Corporation, Santa Clara, Calif.

[21] Appl. No.: 275,655

[22] Filed: Nov. 21, 1988

Related U.S. Application Data

[63] Continuation of Ser. No. 85,998, Aug. 14, 1987, abandoned.

[51] Int. Cl.⁴ .......................................... H01L 21/306
[52] U.S. Cl. .................................... 437/228; 437/241; 437/231; 437/7; 437/235; 156/653
[58] Field of Search .................... 437/228, 225, 229, 8, 437/7, 238, 24, 231, 241, 235; 156/643, 653, 657, 659.1, 626; 148/DIG. 51

[56] References Cited

U.S. PATENT DOCUMENTS

| | | |
|---|---|---|
| 3,976,524 | 8/1976 | Feng . |
| 4,398,997 | 8/1983 | Fang et al. .................... 437/72 |
| 4,407,851 | 10/1983 | Kurosawa ..................... 156/653 |
| 4,506,434 | 3/1985 | Ogaua et al. ................. 437/67 |
| 4,532,696 | 8/1985 | Iwai .............................. 437/67 |
| 4,665,007 | 5/1987 | Cservak ...................... 156/643 |
| 4,676,868 | 6/1987 | Riley et al. .................. 156/643 |
| 4,692,204 | 9/1987 | Fabien et al. ................ 156/643 |
| 4,708,770 | 11/1987 | Fasch ......................... 156/657 |

FOREIGN PATENT DOCUMENTS 0023146 1/1981 European Pat. Off. .

OTHER PUBLICATIONS

Harshburger "Optical Detector . . . " J. Electron Mat., vol. 7, #3 1978, pp. 429–440.

Raby, B. "Mass spectrometric . . . " J. Vac. Sci Technol. 15(2) Mar./Apr. 1978, pp. 205–209.
Adams and Capio (1981) J. Electrochem. Soc. 128:423.
Maroux et al. (1981) Solid State Technology 24:115.
Greene (1978) J. Vac. Sci. Technol. 15:1718.
Caburn J. "Plasma Assisted Etching" Plasma Chemistry and Plasma Processing, vol. 2, #1 1982, pp. 1–41.
Geiger, W. "An Optimized . . . " Proceedings, IEEE VLSI Multilevel Interconnection Conf. 1986, pp. 128–136.

Primary Examiner—Brian E. Hearn
Assistant Examiner—Kevin McAndrews
Attorney, Agent, or Firm—Lee Patch; Robert C. Colwell; James M. Heslin

[57] ABSTRACT

An improved method for the etch-back planarization of interlevel dielectric layers provides for cessation of the etch-back upon exposure of an indicator layer. the indicator layer, usually a metal, metal nitride, or silicon nitride is formed either within the dielectric or over an underlying metallization layer prior to patterning by conventional photolithographic techniques. A sacrificial layer, typically an organic photoresist, is then formed over the dielectric layer. Because of the presence of both relatively narrow and relatively broad features in the metallization, the thickness of the sacrificial layer will vary over features having different widths. As etch back planarization proceeds, the indicator layer which is first encountered releases detectable species into the planarization reactor. Detection of these species indicates that removal of the overlying dielectric layers to a predetermined depth is achieved. By placing the detectable layer over only those regions which are expected to be exposed last, the method can be utilized to indicate the end point of etch back planarization of the interlevel dielectric.

37 Claims, 3 Drawing Sheets

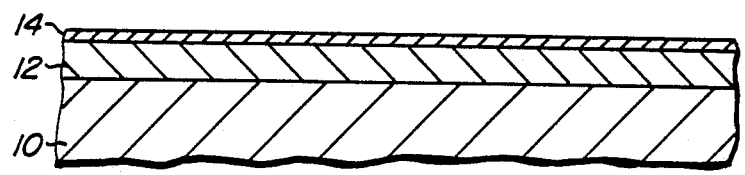
FIG._1.
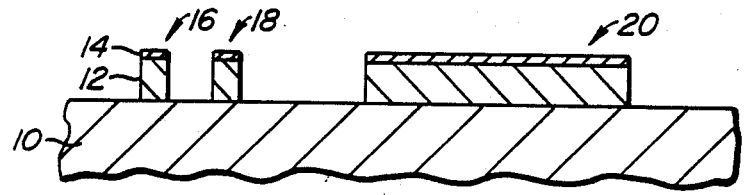
FIG._2.
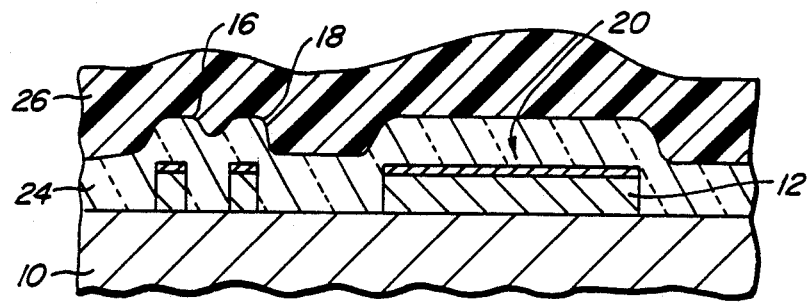
FIG._3.
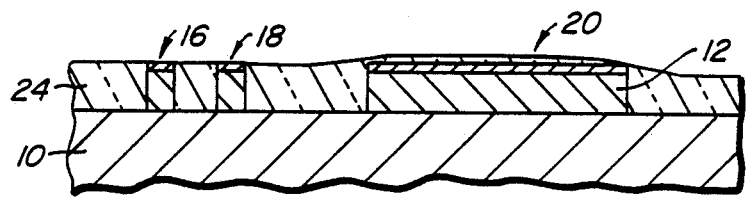
FIG._4.
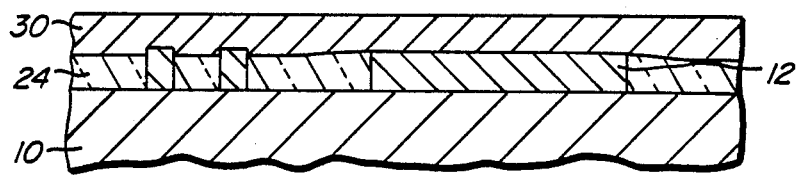
FIG._5.

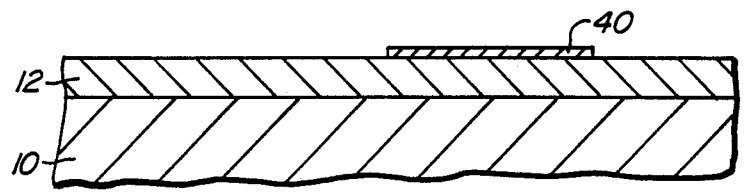
FIG.—6.
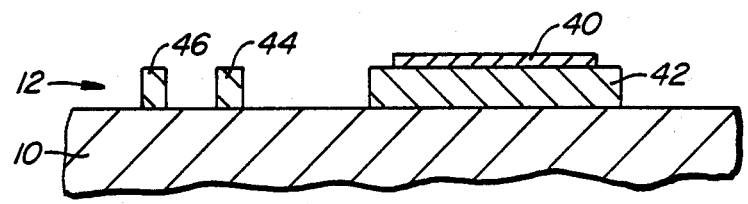
FIG.—7.
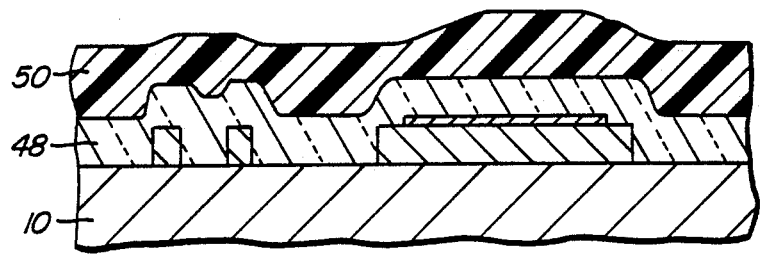
FIG.—8.
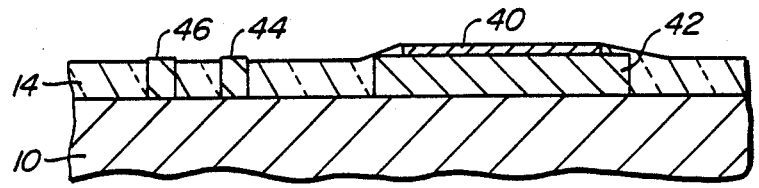
FIG.—9.

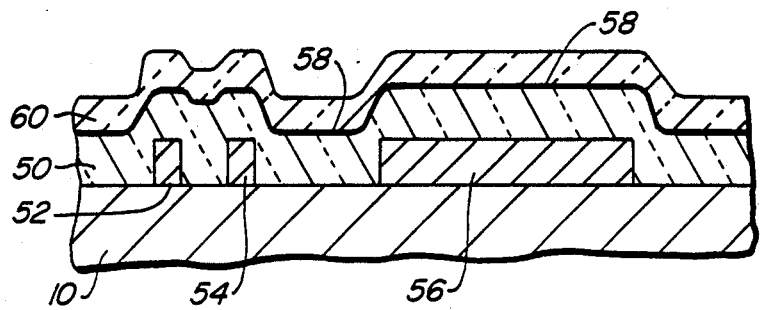
FIG.—10.
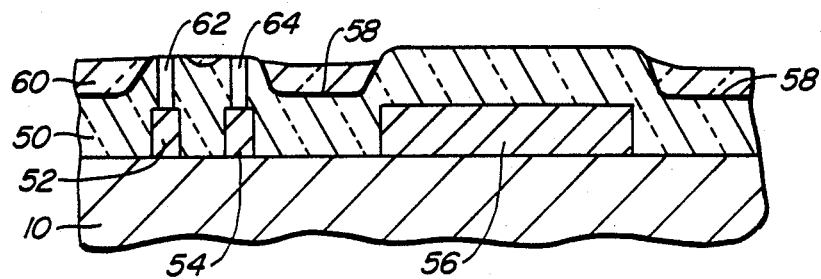
FIG.—11.

ETCH BACK DETECTION

This is a continuation of application Ser. No. 085,998, filed Aug. 14, 1987, now abandoned.

BACKGROUND OF THE INVENTION

1. Field of the Invention

The present invention relates generally to methods for semiconductor fabrication, and more particularly to a method for planarizing interlevel dielectric layers.

Planarization of interlevel dielectric layers in multi-level systems is necessary to lessen or eliminate abrupt topographical variations which would otherwise result in metallization discontinuities or unsatisfactory lithographic pattern transfer. One common approach for planarizing dielectric layers is referred to as the "etch back" technique, where a sacrificial layer, usually an organic photoresist, is spin-coated on a wafer after the dielectric film has been formed on top of an uneven surface, such as a patterned metallization layer or polysilicon features formed over the substrate. The dielectric layer generally conforms to the underlying surface profile so that the dielectric displays an uneven upper surface.

Planarization is then carried out by etching back the combined sacrificial and dielectric layers in a manner which substantially retains the planarity defined by the sacrificial layer. Usually, a plasma etchant is selected which is capable of etching both the sacrificial layer material and the dielectric layer material at approximately the same rate.

The present invention is concerned primarily with a method for detecting when the dielectric layer has been etched back by a preselected amount, either fully so that the underlying features are exposed or partially so that the underlying feature remains covered by a desired thickness of the dielectric material. Full exposure will be necessary, for example, in pillar technologies where an overlying metallization layer is connected to source, drain, and polycrystalline silicon lines or to underlying metallization layers by vertical metal columns, referred to as pillars. Usually, the substrate includes the metal pillars or lines, polycrystalline silicon regions, and field oxide regions which together define a very irregular surface. The dielectric layer conforms closely to the substrate, and coverage by the sacrificial layer produces a film of varying thickness which is usually thin over small or narrow features, but thick over broad features or over densely-packed small features. Pillar technology requires that the intermetallic dielectric must be removed from the top of all pillars in order to make contact with an overlying metallization layer. Sufficient dielectric thickness, however, should be maintained over other portions of the substrate after etch back planarization so that these portions remain electrically isolated.

Partial etch back planarization of the dielectric layer will be desirable when interlevel connections are to be formed using via technology. For example, when an interlevel dielectric layer is formed by Chemical Vapor Deposition over the substrate, it generally conforms to the underlying uneven topography, interfering with subsequent process steps, such as patterning and etching of overlying vias and metallization layers. It is therefore desirable that the interlevel dielectric be at least partially smoothed prior to via formation. The desired smoothing can be achieved by etch back planarization to an intermediate level within the dielectric layer, as is well known.

A problem which is encountered in both full and partial etch back planarization is the lack of an etch stop barrier to provide for termination of the etch. Without such a barrier, it is difficult to determine the appropriate point at which to stop etching. Heretofore, etching has been stopped after a preselected time period based on the expected etch rate under the particular etch conditions. Although generally workable, reliance on timing alone can cause either over-etching or under-etching, neither of which is satisfactory.

It is therefore desirable to provide improved planarization methods useful for smoothing interlevel and intermetallic dielectric layers. In pillar technology, such methods should provide for positive confirmation of the exposure of underlying metallization regions, particularly broad regions of metallization which are covered by relatively thick planarization layers. Similarly, they should provide for a clear indication when a desired partial etch back is achieved in via technology.

2. Description of the Background Art

Adams and Capio (1981) J. Electrochem. Soc. 128:423 describe conventional etch back techniques useful for dielectric planarization. Spectroscopic determination of end points in non-planarization etch processes is described in Marcoux et al. (1981) Solid State Technology 24(4):115 and Greene (1978) J. Vac. Sci. Technol. 15:1718.

SUMMARY OF THE INVENTION

According to the present invention, an improved dielectric planarization method provides for accurate termination of planarization in the absence of an etch stop barrier. The method utilizes an indicator layer which is formed within or beneath the dielectric layer. Planarization etching of the dielectric layer is continued until a desired portion of the indicator layer is exposed and etched. Etching of the indicator layer will release a detectable species into the plasma.

In a first embodiment of the present invention, the indicator layer is formed over a first metallization layer which is subsequently patterned into a plurality of vertical pillar and other regions. An intermetallic dielectric is formed over the patterned metallization layer and exposure of the metallization during etch back planarization is marked by the release of detectable species as a result of etching the indicator layer. In a second embodiment, the indicator layer is formed within the dielectric layer, allowing detection of when a preselected thickness of dielectric remains during etch back. Partial planarization of dielectrics prior to via formation can thus be achieved.

The indicator layer may be a thin film of a metal capable of forming a volatile fluoride, or a substance capable of evolving nitrogen, when etched. Alternately, the indicator layer may be formed by ion implantation of nitrogen into the upper surface of the first metallization layer when forming vertical pillars, or at an appropriate level within the dielectric. The dielectric layer is applied over the indicator layer and will generally conform to the uneven surface defined by the patterned layer. Planarization is accomplished by forming a sacrificial layer, typically by spin-coating an organic polymer over the dielectric layer. Although the sacrificial layer generally defines a smoothed surface over the entire wafer being treated, the layer will generally be thicker over broad features (and densely-packed narrow features) than over isolated narrow features. Planarization is accomplished by etching back the combined sacrificial and dielectric layers, typically in a fluorine and oxygen-containing plasma capable of etching both layers at substantially similar rates.

As previously described, an indicator layer, within or beneath the dielectric layer, affords an accurate determination of end-point in etch back planarization. However, the practical case in which features of different sizes or densities, or both, are present on the wafer surface complicates end point determination. As the thickness of the sacrificial layer over the broad features is generally greater than over the narrow and isolated features, different features will be exposed at different times during the etch back. Detection of the indicator layer, however, indicates that at least certain features have been exposed. Frequently, it will be desirable to form the indicator layer over only the broad features which will generally have thicker sacrificial layers which will take longer to etch. By basing the end point on exposure of the broad feature, exposure of both the narrow and broad features will be assured. After exposure of the pillars formed from the first metallization layer, a second metallization layer is formed by conventional techniques.

When employing via technology, the indicator layer is formed at an intermediate level within the dielectric, where the location of the intermediate level is selected to provide a desired thickness of dielectric over the features to be connected. Typically, the indicator layer will be formed by interrupting the deposition of the dielectric layer to deposit the indicator layer by any of the techniques discussed above. Alternatively, it will be possible to introduce indicator species to the dielectric during deposition. By introducing the indicator species, e.g., nitrogen compounds, during a brief period only, their location within the dielectric layer can be limited to a well-defined stratum.

The method of the present invention is suitable for planarizing the dielectric formed directly on the wafer substrate as well as for planarizing the dielectric formed on overlying metallization layers.

BRIEF DESCRIPTION OF THE DRAWINGS

FIGS. 1-5 illustrate a cross-section of a semiconductor wafer substrate undergoing the formation of an intermetallic dielectric layer according to the method of the present invention.

FIGS. 6-9 are a cross-section of a semiconductor wafer undergoing the formation of an intermetallic dielectric layer according to an alternate embodiment of the method of the present invention.

FIGS. 10 and 11 illustrate the formation of an interlevel dielectric useful for via formation, according to the method of the present invention.

DESCRIPTION OF THE SPECIFIC EMBODIMENTS

Referring to FIG. 1, a substrate 10 comprises a portion of a semiconductor wafer which is undergoing processing according to the method of the present invention. The substrate 10 includes a plurality of active regions, including transistors, capacitors, and other metallic and polysilicon features, many of which require interconnection with overlying metallization layers formed in subsequent processing steps. The various surface features on the substrate, however, create an uneven topography which interferes with the application of the required metallization layer(s), and the present invention provides for the formation of planarized and partially planarized interlevel dielectric layers which facilitate such application. The invention will be illustrated in connection with a dielectric layer being applied directly over a wafer substrate. The invention, however, is not limited to such applications and is equally useful in forming dielectric layers between successive metallization layers. Referring to FIGS. 1-5, a first metallization layer 12 is formed over the substrate 10, which layer is capable of being patterned by photolithographic and other patterning techniques to define necessary interconnections, including metal lines, pillars, and relatively broad metal features and regions. The first metallization layer will usually be aluminum, or an aluminum alloy, having a thickness of about 1 $\mu$m.

The present invention calls for the formation of an indicator layer 14 over the upper surface of the metallization layer 12. The indicator layer 14 comprises a thin film of a material which evolves detectable volatile species when subjected to the plasma used for the planarization etch, as will be described in more detail hereinbelow. Suitable materials for the indicator layer 14 include metals, such as tungsten, molybdenum, tantalum, and titanium, which form detectable fluorides when etched in a fluorine-containing plasma. Alternatively, the material may be a substance which evolves nitrogen when subjected to plasma etching, including silicon nitride and metal nitrides such as chromium nitride, titanium nitride, tungsten nitride, aluminum nitride, and the like.

The metal layers and metal nitride layers may be deposited by any conventional technique, typically by chemical vapor deposition (CVD), low pressure chemical vapor deposition (LPCVD), or sputter deposition. Particularly preferred are the use of CVD applied silicon nitride and metal nitrides which provide nitrogen molecules upon plasma etching.

As an alternative to forming a discrete layer 14, nitrogen can be implanted into a thin region on the surface of metallization layer 12 by known ion implantation techniques. Suitable nitrogen dosages range from about $10^{14}$ to $10^{17}$ atoms/cm$^2$, usually being about $10^{15}$ to $10^{16}$ atoms/cm$^2$. Normally, low implantation energies are employed so that the nitrogen is concentrated at the surface of the metallization.

The use of nitrogen in the indicator layer (or implanted into the metallization layer) is preferred when the areas being exposed are small. Nitrogen has a high excitation efficiency which facilitates spectroscopic detection, even when present in very small quantities.

The thickness of the indicator layer is not critical, but sufficient material should be deposited to provide a detectable signal when volatilized into the plasma. Usually, the thickness will be in the range from about 200 to 2000 Å, more usually in the range from about 500 to 1000 Å.

Referring to FIGS. 2 and 3, the metallization layer and indicator layer 14 are patterned by photolithographic techniques, leaving a desired configuration of lines, pillars, and broad regions on the surface of the substrate 10. A line 16, pillar 18, and relatively broad region 20 are illustrated as being exemplary of such metallization features in FIG. 2. Prior to forming an overlying second metallization layer to interconnect the various regions of the first metallization layer 12, it is necessary to deposit an interlevel dielectric layer 24 isolating the substrate from overlying metallization.

Referring now to FIG. 3, the dielectric layer 24 is applied over the substrate 10 and first metallization layer 12. Conveniently, the dielectric layer 24 will be silicon dioxide deposited by CVD, usually LPCVD, to an average thickness in the range from about 0.3 to 2.0 $\mu$m, usually being about 0.8 $\mu$m. The dielectric layer 24 conforms closely to the uneven topography of the metallization layer 12 on the substrate 10. Thus, the upper surface of the dielectric layer 24 will be higher over raised regions, e.g., line 16, pillar 18, and region 20, than it is over the open regions on the upper surface of substrate 10. The application of an overlying sacrificial layer 26 results in a smoothed surface. The sacrificial layer 26 is an organic polymer, typically a photoresist, which is spin-coated over the dielectric layer 24, to an average thickness in the range from about 0.5 to 6 $\mu$m, usually being about 1.0 $\mu$m. Although spin-coating tends to planarize the upper surface of the sacrificial layer 26, the material will still be thicker over broad raised features (such as region 20) than over the more narrow raised features (such as line 16 and pillar 18).

The definition of "broad" regions is somewhat imprecise, but will generally include features having width exceeding 4 $\mu$m, usually exceeding 6 $\mu$m, and more usually exceeding 10 $\mu$m. Such regions generally result in thickening of the sacrificial layer relative to the sacrificial layer over more narrow features.

Because of the greater thickness of the sacrificial layer 26 over the broad regions, a planarization etch, under conditions chosen to have a uniform etch rate through both the planarization material and the dielectric material, will not be expected to reach all regions of metallization 12 simultaneously. Rather, the situation will be expected to be as illustrated in FIG. 4, where the relatively narrow metallization features 16 and 18 will be exposed prior to exposure of the relatively broad metallization region 20. Thus, even after the narrow regions 16 and 18 are exposed, a thin layer of dielectric 24 will remain over the broad region 20. The method of the present invention, however, allows detection of the initial exposure of the narrow regions, allowing the etching to continue for a sufficient period in order to uncover the broader regions 20 without substantial over-etching.

The planarization etching is typically accomplished in a conventional plasma reactor by established techniques. The plasma selected will contain both fluorine, typically from carbon tetrafluoride, to etch the silicon dioxide dielectric, and oxygen to etch the organic polymer of the sacrificial layer 26. Conveniently, the etchant will include carbon tetrafluoride and oxygen, usually in an inert diluent, typically argon or helium.

As the etching is carried out, gases resulting from the etching are monitored, typically using standard spectroscopic techniques, such as emission spectroscopy. Emissions characteristic of the indicator layer 14 are monitored, and when detected, are indicative of exposure of at least the initial portion of said indicator layer. For example, emissions at a wavelength in the range from about 300 to 900 nm, e.g., 337 nm, are characteristic of nitrogen molecules excited in a plasma. Usually, the planarization etch is not stopped immediately upon detection of the indicator layer, but rather is continued for a sufficient time to assure that all areas of the metallization 12 are uncovered.

It is not necessary that the indicator layers 14 themselves be removed when they are composed of electrically conductive materials, such as metals or metal nitrides. In the case of non-conductive materials, such as silicon nitride, it will be necessary to etch the layer entirely from the upper surface of the metallization regions.

Referring to FIG. 5, after planarization of the dielectric layer 24 is completed, a second metallization layer 30 will be formed over both the dielectric layer and first metallization layer 12. The second metallization layer 30 will then be patterned in a desired configuration in order to provide the desired interconnections between the various regions in the first metallization layer 12.

Referring now to FIGS. 6–9, an alternative method according to the present invention will be described. A wafer substrate 10 and first metallization layer 12 are formed as described previously in connection with FIG. 1. An indicator layer 40 is also formed, but is patterned using an additional non-critical mask so that it lies only over broad regions (e.g., 42) in the metallization layer 12.

In the case of metal, metal nitride, and silicon nitride indicator layers, patterning may be achieved by conventional photolithographic and other known patterning techniques. In the case of ion implanted nitrogen, implantation should be directed only at the desired areas in the metallization layer 12. The result is a limited region 40 of an indicator material, as described previously.

The metallization layer 12 is then patterned by photolithographic techniques resulting in the structure of FIG. 7, where the indicator layer 40 overlies a broad region 42, and narrow features 44 and 46 are not covered by the detectable material.

A dielectric layer 48 and sacrificial layer 50 are then formed over the metallization layer 12 and substrate 10 as illustrated in FIG. 8. Planarization of the dielectric layer 48 is then carried out as described previously, except that no detectable species are released when the narrow features 44 and 46 are first uncovered. Instead, detectable species are released only when the broad region 42 is uncovered, as illustrated in FIG. 9. In this way, etching can be stopped precisely at the time when the broad regions are uncovered. As the broad regions take longer to be uncovered than the narrow regions, it will be assured that all metallization regions on the substrate will be uncovered prior to ending the etch.

In addition to providing an end of etch indicator for etch back planarization, the indicator layer may reduce surface reflectivities significantly, particularly when employing tungsten, titanium, or silicon nitride as the indicator material. This improves photolithographic pattern transfer, particularly over aluminum metallization. Furthermore, it has been shown that the use of such thin films over aluminum metallization can reduce hillock formation.

Referring to FIGS. 10 and 11, the present invention will also find use in partial planarization of dielectric layers used as interlayer dielectrics in via structures. Generally, rather than forming the indicator layer directly over a metallization layer (as previously described), the indicator layer is formed within the dielectric below its upper surface and above the underlying substrate or metallization. A sacrificial layer is then formed over the dielectric layer, and the combined layers etched back until the indicator layer is exposed. By properly placing the indicator layer within the dielectric, a desired thickness of dielectric material can be left over the underlying metallization and active regions. The underlying features may then be connected to an overlying metallization layer by forming vias according to well known technology.

A lower dielectric layer 50 is deposited over substrate 10, covering narrow features 52 and 54 as well as broad feature 56. Indicator layer 58 is then formed directly over the lower dielectric layer 50, with both the dielectric 50 and indicator 58 conforming to the features 52, 54 and 58, formed on the substrate 10. An upper dielectric layer 60 is next formed over the indicator layer 58, with the resulting structure illustrated in FIG. 10. The thickness of lower layer 50 generally corresponds to the desired thickness of dielectric over the features 52, 54, and 58. The thickness of layer 60 should be sufficient so that the total dielectric thickness over featureless regions of the substrate is equal to the combined height of the raised features and the desired overlying dielectric. In this way, a generally uniform layer of dielectric over the substrate results after etch-back planarization carried out using a sacrificial layer in the manner described above, as illustrated in FIG. 11.

After planarization, vias 62 and 64 may be formed in the dielectric layer 50 and 60 to provide for connection to an overlying metallization layer in a conventional manner.

Although the foregoing invention has been described in some detail by way of illustration and example for purposes of clarity of understanding, it will be obvious that certain changes and modifications may be practiced within the scope of the appended claims.

What is claimed is:

1. A method for planarizing an interlevel dielectric layer, said method comprising: applying an indicator layer capable of evolving a volatile detectable species during planarization, said layer being applied over at least a portion of an uneven topographic surface;
    applying a dielectric layer over the indicator layer;
    planarizing the dielectric layer under conditions which etch back both the dielectric layer and the indicator layer;
    monitoring for the presence of the volatile detectable species; and
    terminating planarization within a predetermined time period of detection of the volatile detectable species.

2. A method as in claim 1, wherein the indicator layer is composed of a metal capable of forming a volatile fluoride or a substance which will evolve nitrogen when etched.

3. A method as in claim 2, wherein the metal is selected from the group consisting of tungsten, molybdenum, tantalum, and titanium.

4. A method as in claim 2, wherein the nitrogen-evolving substance is selected from the group consisting of the nitrides of chromium, titanium, tungsten, and aluminum.

5. A method as in claim 2, wherein the nitrogen-evolving substance is silicon nitride applied by chemical vapor deposition.

6. A method as in claim 1, wherein the detectable layer is applied by ion implantation of nitrogen into the underlying substrate.

7. A method as in claim 1, wherein the dielectric layer is silicon dioxide applied by chemical vapor deposition.

8. A method as in claim 1, wherein the dielectric layer is planarized by first forming a sacrificial layer over the dielectric layer and thereafter etching back the combined sacrificial layer and dielectric layer.

9. A method as in claim 1, wherein the indicator layer is formed over only the broad features on the surface.

10. A method as in claim I, wherein the indicator layer is formed over the entire surface.

11. A method for planarizing intermetallic dielectric layers, said method comprising:
    applying a thin film of a detectable material over at least a portion of a first metallization layer, said material being capable of forming a volatile detectable species when subjected to fluorine-containing plasma etching;
    applying a dielectric layer over the thin film and the first metallization layer;
    forming a sacrificial layer over the dielectric layer;
    etching the combined sacrificial and dielectric layers using a fluorine-containing plasma under the preselected conditions which substantially retain planarity;
    monitoring for the presence of the volatile detectable species; and
    ceasing etching within a predetermined time period of detecting the presence of the volatile detectable species.

12. A method as in claim 11, wherein the detectable material is a metal capable of forming a volatile fluoride or a substance which will evolve nitrogen when etched.

13. A method as in claim 12, wherein the metal is selected from the group consisting of tungsten, molybdenum, tantalum, and titanium.

14. A method as in claim 12, wherein the nitrogen-evolving substance is selected from the group consisting of the nitrides of chromium, titanium, tungsten, and aluminum.

15. A method as in claim 12, wherein the nitrogen-evolving substance is silicon nitride applied by chemical vapor deposition.

16. A method as in claim 11, wherein the detectable material results from ion implantation of nitrogen into the first metallization layer.

17. A method as in claim 11, wherein the dielectric is silicon dioxide applied by chemical vapor deposition.

18. A method as in claim 11, wherein the sacrificial layer is an organic polymer applied by spin-coating.

19. A method as in claim 11, wherein the combined sacrificial and dielectric layers are etched in a fluorine-containing plasma.

20. A method as in claim 19, wherein the plasma is carbon tetrafluoride and oxygen.

21. A method as in claim 11, wherein the volatile detectable species is detected by emission spectroscopy.

22. A method as in claim 11, wherein the thin film material is electrically conductive and a portion of the film remains after the etching back is completed.

23. In a method of planarizing dielectric layers formed over uneven topographic substrates, the improvement comprising applying an indicator layer beneath or within the dielectric layer at a position proximate the location where it is desired to stop planarization, said indicator layer being capable of evolving detectable volatile species when subjected to planarization under conditions which etch back said dielectric layer; and terminating planarization within a predetermined time period of detection of the volatile species.

24. A method as in claim 23, wherein the indicator layer is applied after a first portion of the dielectric layer is formed and before a second portion of the dielectric layer is formed.

25. A method as in claim 23, wherein the indicator layer is applied prior to formation of the dielectric layer.

26. A method as in claim 24, wherein the first portion of the dielectric layer has a thickness corresponding to the desired thickness of dielectric over active regions and metallization on the substrate.

27. A method as in claim 26, wherein the thickness of the second portion of the dielectric layer is selected so that the combined thicknesses of the first and second portions is at least as great as the height of the metallization on the substrate.

28. A method for planarizing an interlevel dielectric layer, said method comprising:
 applying a lower dielectric layer over a substrate;
 applying an indicator layer capable of evolving a volatile detectable species during planarization over the lower dielectric layer;
 apply an upper dielectric layer over the indicator layer; and
 planarizing the dielectric layer under conditions which etch back the dielectric layers and evolve detectable species when volatizing the indicator layer;
 ceasing planarization when volatile detectable species are detected indicating that at least a portion of the indicator layer is exposed.

29. A method as in claim 28, wherein the indicator layer is composed of a metal capable of forming a volatile fluoride or a substance which will evolve nitrogen when etched.

30. A method as in claim 29, wherein the metal is selected from the group consisting of tungsten, molybdenum, tantalum, and titanium.

31. A method as in claim 29, wherein the nitrogen-evolving substance is selected from the group consisting of the nitrides of chromium, titanium, tungsten, and aluminum.

32. A method as in claim 29, wherein the nitrogen-evolving substance is silicon nitride applied by chemical vapor deposition.

33. A method as in claim 28, wherein the detectable layer is applied by ion implantation of nitrogen into the underlying substrate.

34. A method as in claim 28, wherein the dielectric layer is silicon dioxide applied by chemical vapor deposition.

35. A method as in claim 28, wherein the dielectric layer is planarized by first forming a sacrificial layer over the dielectric layer and thereafter etching back the combined sacrificial layer and dielectric layer.

36. A method as in claim 28, wherein the indicator layer is formed over only the broad features on the surface.

37. A method as in claim 28, wherein the indicator layer is formed over the entire surface.

* * * * *